United States Patent [19]

Maddox

[11] Patent Number: 4,467,224

[45] Date of Patent: Aug. 21, 1984

[54] SYSTEM FOR APPLYING A HIGH VOLTAGE SOURCE TO A CRT THROUGH A CAPACITIVE LOAD

[75] Inventor: William J. Maddox, Lancaster, Pa.

[73] Assignee: RCA Corporation, New York, N.Y.

[21] Appl. No.: 359,611

[22] Filed: Mar. 18, 1982

[51] Int. Cl.³ .................... H03K 17/687; H03K 3/26
[52] U.S. Cl. .................................. 307/270; 307/595; 307/265; 307/311
[58] Field of Search ............... 307/595, 597, 246, 241, 307/242, 243, 255, 585, 265, 311, 540, 549, 571, 270; 330/263, 269

[56] References Cited

U.S. PATENT DOCUMENTS

| | | | |
|---|---|---|---|
| 2,122,499 | 7/1938 | Stocker | 171/95 |
| 3,649,851 | 3/1972 | Cohen | 307/246 |
| 3,656,004 | 4/1972 | Kemerer et al. | 307/246 |
| 4,283,639 | 8/1981 | Roesler | 307/269 |
| 4,293,875 | 10/1981 | Katz | 330/263 |
| 4,311,922 | 1/1982 | Puckette | 307/540 |
| 4,329,600 | 5/1982 | Stewart | 307/571 |
| 4,359,650 | 11/1982 | Newcomb | 307/270 |
| 4,363,978 | 12/1982 | Heimbigner | 307/270 |
| 4,409,639 | 10/1983 | Wesner | 307/597 |

*Primary Examiner*—John S. Heyman
*Assistant Examiner*—Timothy P. Callahan
*Attorney, Agent, or Firm*—Eugene M. Whitacre; Dennis H. Irlbeck; Lester L. Hallacher

[57] ABSTRACT

A system for applying a high test voltage to a CRT through a high capacitance load includes two serially connected MOSFETs which have opposite polarities. A video input pulse triggers one MOSFET through an opto-isolation network. The video pulse is delayed and triggers the other MOSFET. The trigger pulses are the same polarity and only one of the MOSFETs can conduct at a given time. The capacitive load is coupled between the MOSFETs and received a high voltage short time pulse when one of the MOSFETs is conductive. The use of two MOSFETs permits the testing of both cathode driven and grid driven CRTs.

9 Claims, 3 Drawing Figures

: 1

SYSTEM FOR APPLYING A HIGH VOLTAGE SOURCE TO A CRT THROUGH A CAPACITIVE LOAD

BACKGROUND OF THE INVENTION

This invention relates generally to the testing of cathode ray tubes (CRT) and particularly to a system for applying a high voltage source to such a tube through a cable which constitutes a high capacitive load.

One of the final stages in the production of color television picture tubes is that of testing the tube for focus and convergence using a high voltage drive. The convergence test is needed to assure that the electron beams from the three electron guns converge at the proper point with respect to the shadow mask so that the color purity is acceptable. The focus test is needed to assure that the electron beams are properly focused. Additionally, typically color television tubes defocus if driven by too high a voltage. Thus, a high voltage drive test is used to measure the capability of the tube to stay focused during the presence of a high drive voltage.

Typically, during test, the drive voltage is applied to the tube under test from a remote test station. Accordingly, a long coaxial cable is used to couple the tube to the test station. Such cables have high capacitance making it difficult to apply a high voltage, narrow time pulse to the tubes.

The instant invention fulfills this requirement by the provision of a system for applying a high voltage, narrow time pulse to a cathode ray tube through a high capacitive load, such as a coaxial cable.

SUMMARY OF THE INVENTION

A system for applying a high voltage source to a CRT through a capacitive load includes a p-type electron control means and a n-type electron control means for alternately coupling the load to the high voltage source when one of the electron control means is conductive. An input pulse is received and a control pulse is provided. The control pulse is delayed and provided as a delay control pulse. The delayed control pulse renders one type of the electron control means conductive. Additional means is responsive to the control pulse and provides a stretched control pulse. The stretched control pulse renders the other type of electron control means conductive when the first type is nonconductive and nonconductive when the first type is conductive.

DETAILED DESCRIPTION OF THE PREFERRED EMBODIMENT

Figure 1:
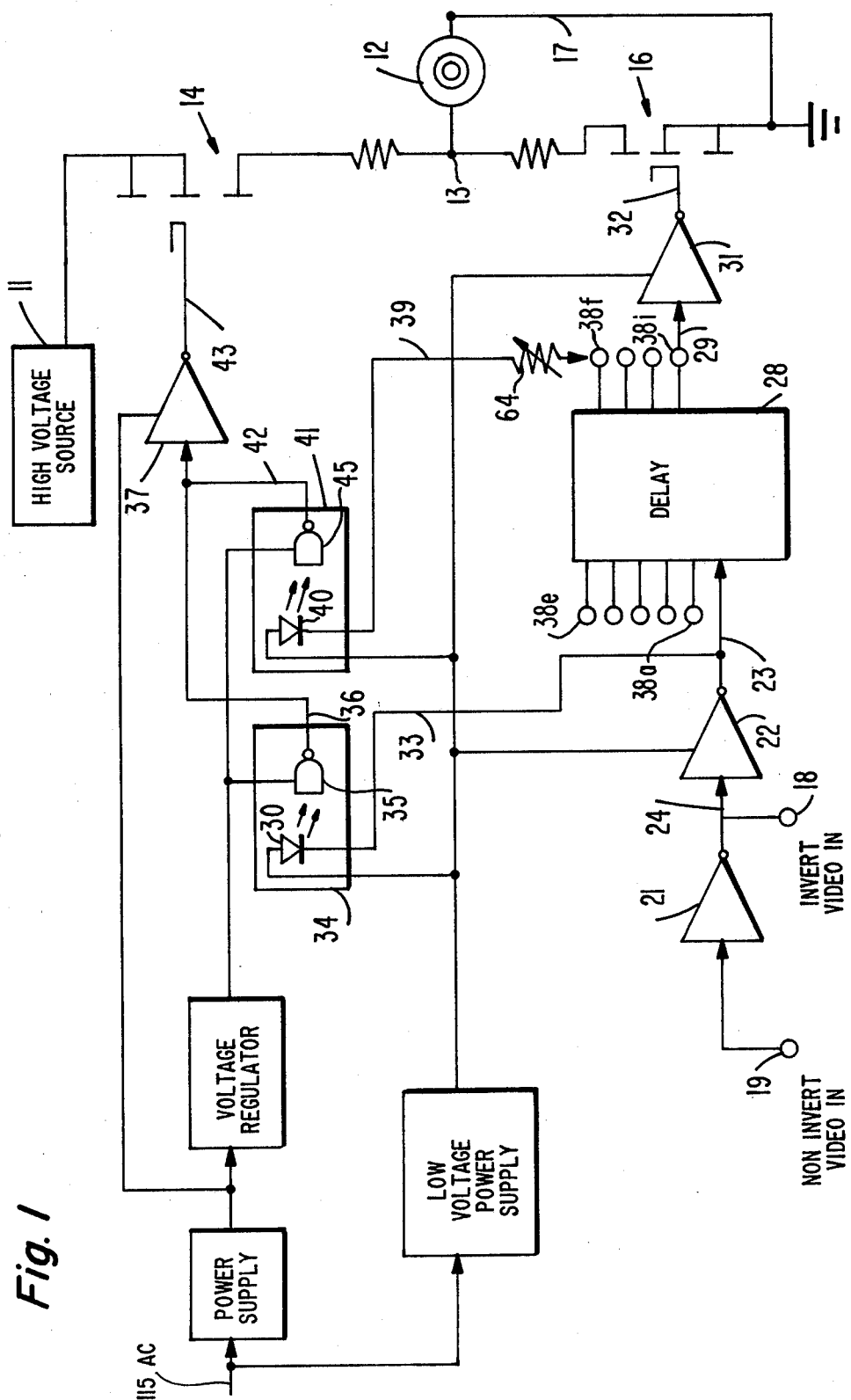
FIG. 1 is preferred embodiment of the invention.

FIG. 1 shows a system 10 for connecting a high voltage source 11 to a cathode ray tube (not shown) through a high capacitive coaxial cable which would be connected to a coaxial coupling 12. The coaxial coupling 12 is coupled between the junction 13 of two MOSFET devices 14 and 16 and to ground by a line 17.

The system 10 includes an invert video input terminal 18 and a non-invert video input terminal 19. When a non-invert mode of operation is utilized, a narrow time video input pulse is applied to an inverter 21 by the input terminal 19. The output of the inverter 21 is applied to an inverter 22 by the line 24. When an invert mode of operation is utilized, the video input pulse is applied to the inverter 22 by the input terminal 18. In the invert mode of operation, the inverter 21 is not utilized. The output signal from the inverter 22 is available on an output line 23 and serves as a control pulse for the invert and non-invert modes of operation. The selection of the invert or non-invert modes of operation is dependent upon the type of drive which is used for the CRT under test. Thus, when the CRT is grid driven, the non-invert mode of operation is utilized. When the CRT is cathode driven, the invert mode of operation is utilized. Typically, a CRT is cathode driven. However, some commercial applications use grid driven CRTs and accordingly, the capability of testing either tube type with the same system is advantageous.

The control pulse available on the line 23 is applied as an input to a delay 28, the output of which is a delayed control pulse on an output line 29. The delayed control pulse is input to an inverter 31. The output pulse on the output line 32 of the inverter 31 triggers the gate of the n-type MOSFET 16 and the MOSFET becomes conductive when the delayed control pulse is positive. The control pulse available on the output line 23 of the inverter 22 is also applied by a line 33 to an opto-isolator 34, the output lead 36 of which is coupled to an inverter 37. The output of the inverter 37 is available on a line 43 and triggers the gate of a p-type MOSFET 14 and the MOSFET becomes conductive when pulse is negative. The opto-isolator 34, including a LED 30 and a detector 35, isolates the various portions of the system from the noise of the other portions, and permits the devices 34, 41, and 37 to operate at the high voltage needed to drive the p-type MOSFET 14, the source of which is at a voltage level set by the power supply 11.

The delay 28 has a plurality of output taps 38a through 38i so that the total delay time can be tapped in increments of 10%. A line 39 is coupled to one of the taps 38a through 38h and serves as an input to another opto-isolator 41 including a LED 40 and a detector 45. The isolators 34 and 41 are standard devices available commercially, such as model HCPL 2601 available from Hewlett Packard. The input of the opto-isolator 41 is delayed and the isolator 41 remains on after the termination of the control pulse available on line 23 turns off the isolator 34. The output of the opto-isolator 41 also is coupled by a line 42 to the inverter 37. The isolators are coupled to the inverter 37 in a NOR type connection and therefore the output of the inverter 37 is high whenever one of the isolators 34 or 41 has a low output. Accordingly, the combined operation of the isolators 34 and 41 is that of stretching the control pulse which is available on the output line 23. The output of the inverter 37 is coupled to the gate of the p-type MOSFET 14 and the MOSFET 14 is nonconductive when either or both of the opto-isolators 34 and 41 has a low output so that the output of the inverter 37 is high.

Figure 2:
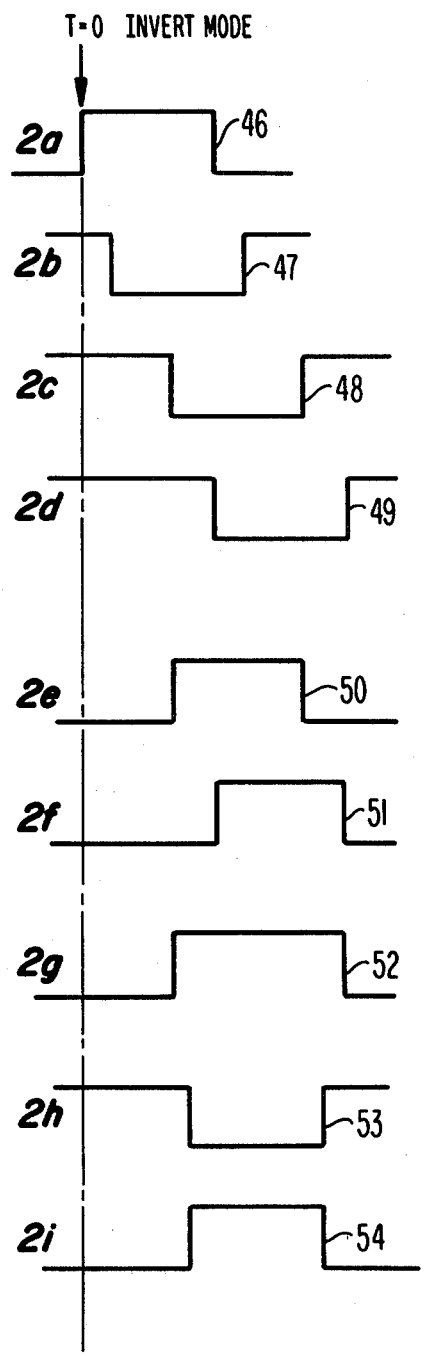
FIGS. 2a through 2i show the operative pulses at various points through the system for the invert mode of operation.

FIGS. 2a to 2i show the operative pulses when the inventive system is used in the invert mode. A positive video input pulse 46 of FIG. 2a, having a pulse width of 120 nanoseconds for example, is applied to the input terminal 18 and is inverted by the inverter 22. The negative control pulse 47 of FIG. 2b is then available on the output lead 23. The negative control pulse 47 is applied to the LED 30 of the opto-isolator 34 and the detector 35 is energized by light from the LED. The detector 35 is arranged in an invert connection and the negative pulse 48 of FIG. 2c is available as an output on the output lead 36. Because of the inherent time delay of the isolator 34, the pulse 48 is delayed by approximately 50 nanoseconds, as indicated by the delay in FIG. 2c. The other pulses throughout the system also are delayed by the various devices. These delays do not adversely affect the operation of the system and are not considered in the operation as explained herein. The output pulse 48 on line 36 is applied as an input to the inverter 37. Accordingly, if the opto-isolator 41 were not present in the system, the positive pulse 50 of FIG. 2e would be available on the output lead 43 of the inverter 37. The positive pulse 50 is coupled to the gate of the p-type MOSFET 14 and the MOSFET is nonconductive.

The negative control pulse 47 on the line 23 is also applied to the delay 28. The LED 40 of the opto-isolator 41 is coupled to the output of the delay 28 through one of the taps 38a through 38h. Accordingly, the output of the inverting detector 45 of the opto-isolator 41 is the delayed negative pulse 49 shown in FIG. 2d. The percentage of delay is selected to assure that the positive pulse on the gate of MOSFET 14 does not terminate before the pulse applied to the gate of the MOSFET 16 terminates. The output line 42 of the isolator 41 also is coupled to the inverter 37 and the MOSFET 14 is held nonconductive by the positive pulse 51 of FIG. 2f. The pulse 51 is that which would be available on the output line 43 if the opto-isolator 34 were not present in the system. The isolators 34 and 41 are both coupled to the inverter 37. Accordingly, as shown by the positive pulse 52 in FIG. 2g, the output of the inverter 37 is high whenever either of the isolators 34 or 41 is on. The parallel operation of the isolators 34 and 41 functions as logic NOR operation. This operation has the effect of stretching the control pulse 47 of FIG. 2b, thereby assuring that the MOSFET 14 remains nonconductive after the termination of the input pulse 46 of FIG. 2a.

The negative control pulse 47 on the output lead 23 of the inverter 26 also is applied to the delay 28. The negative delayed control pulse 53 of FIG. 2h is then available on the output line 29 of the delay 28. The delayed control pulse 53 is applied to the inverter 31 and the positive trigger pulse 54 of FIG. 2i is applied to the gate of the n-type MOSFET 16 and the MOSFET is conductive. The pulse 54 of FIG. 2i is delayed by the delay 28 and also by the inherent delays of the inverters 26 and 31. The initial side of the pulse 54 therefore is delayed, by 100 nanoseconds for exmaple, with respect to the initial side of the video input pulse 46 of FIG. 2a. The pulse 54 has the same width, in time, as the video input pulse 46, for example 120 nanoseconds. The positive pulse 54 renders the n-type MOSFET 16 conductive for the duration of the pulse. During this time, the positive pulse 52 maintains the p-type MOSFET 14 nonconductive. Accordingly, the cathode of the CRT under test is driven negative as required for cathode driven tubes. The simultaneous application of pulses having the same polarity to MOSFETs having different polarities assures that both MOSFETs are not simultaneously conductive and the source 11 cannot be shorted.

Figure 3:
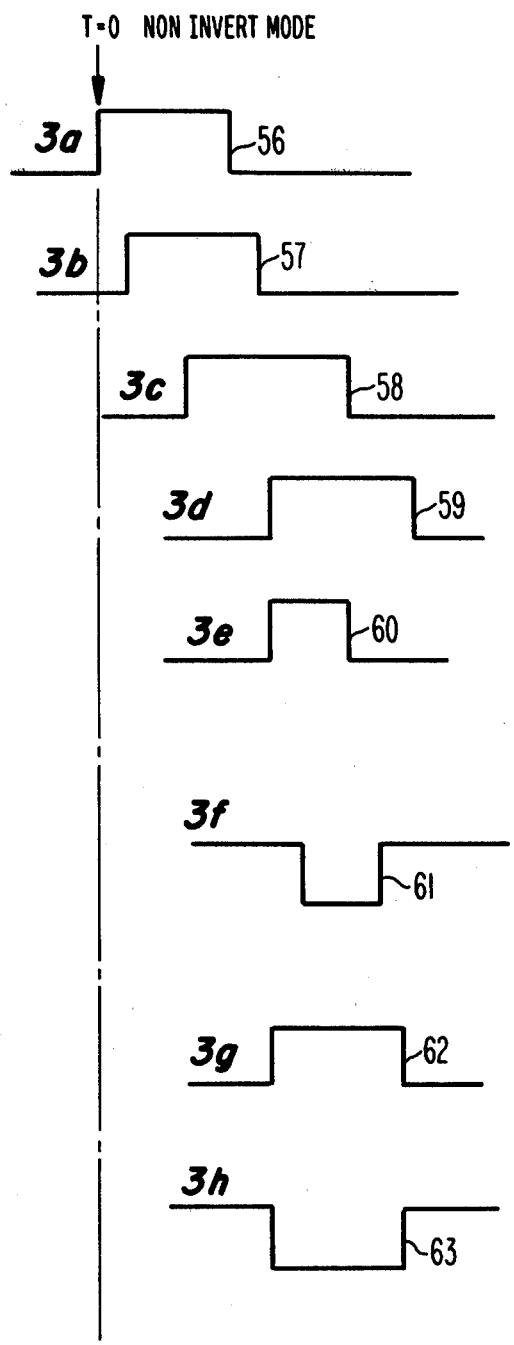
FIGS. 3a through 3h show the operative pulses at various points throughout the system for the non-invert mode of operation.

FIGS. 3a to 3h show the operation of the system when the non-invert mode is utilized for testing grid driven tubes. The pulse 56 of FIG. 3a is applied to the input terminal 19. The input pulse 56 is inverted by the inverter 21 and reinverted by the inverter 22 and the control pulse 57 on the line 23 is positive as shown in FIG. 3b. The control pulse 57 is applied by line 33 to the LED 30 of the opto-isolator 34 and the LED is turned off. The output of the inverting detector 35 therefore is the positive pulse 58 of FIG. 3c. The isolators 34 and 41 have output lines 34 and 42, respectively, wired common and thus function as a NOR gate. The gate of the MOSFET 14 therefore does not go negative until both of the isolators 34 and 41 have a high output. The MOSFET 14 therefore remains off when the output of isolator 34 initially goes high.

The control pulse 57 of FIG. 3b is also applied to the delay gate 28. The tapped line 39 is connected to one of the output taps 38a through 38h to provide a delayed input to the LED 40 of the opto-isolator 41 so that the output of the inverting detector 45 is high and the positive pulse 59 of FIG. 3d is available on the output lead 42. Because of the delayed input to isolator 41 the output pulses 58 and 59 overlap for a short period of time. Accordingly the pulse 60 of FIG. 3e is applied to the inverter 37 when both isolators are off. The pulse 60 is inverted by the inverter 37 and negative pulse 61 of FIG. 3f is applied to the gate of the MOSFET 14 and the MOSFET is conductive. The input to the LED 40 can be applied through a variable resistor 64 to narrow the output pulse of the isolator 41.

The positive control pulse 57 on line 23 also is applied to the delay 28 resulting in the positive delayed control pulse 62 of FIG. 3g on the output line 29. The delayed control pulse 62 is inverted by inverter 31 and the negative pulse 63 of FIG. 3h is applied by output 37 to the gate of the n-type MOSFET 16. The n-type MOSFET 16 cannot conduct and the voltage source 11 is not shorted to ground. The voltage source 11 is thus connected to the grid of the CRT through the MOSFET 14, the junction 13 and coaxial connector 12.

The high voltage source 11 is connected to the CRT through the high capacitance load by a high voltage, narrow time pulse in both the invert and non-invert modes of operation and both cathode driven and grid driven CRTs can be tested with the inventive system using a coaxial cable to connect the test set and tube being tested.

What is claimed is:

1. A system for applying a high voltage pulse to a CRT through a high capacitance load comprising p-type electron control means and n-type electron control means for alternatley coupling said load to said high voltage source when one type of said electron control means is conductive;

means for receiving an input pulse and providing a control pulse;

delay means responsive to said control pulse for providing a delayed control pulse;

first means responsive to said delayed control pulse for rendering one type of said electron control means conductive when said input pulse is positive and non-conductive when said input pulse is negative;

second means responsive to said control pulse for providing a stretched control pulse; and third means responsive to said stretched control pulse for rendering the other type of electron control means conductive when said one type is nonconductive and nonconductive when said one type is conductive.

2. The system of claim 1 is wherein said electron control means are solid state devices.

3. The system of claim 2 wherein said second means remains conductive after said control pulse terminates whereby the state of said other type of electron control means remains unchanged after said control pulse terminates.

4. The system of claim 3 wherein said second means includes at least two opto-isolators, one of said opto-isolators being responsive to said control pulse and another of said opto-isolators being responsive to said delay means.

5. The system of claim 4 wherein said means for receiving and said first means are inverters.

6. The system of claim 5 wherein said solid state devices are MOSFETs.

7. The system of claims 2 or 5 wherein said solid state devices are MOSFETs and said load is coupled between said MOSFETs.

8. The system of claim 7 wherein said means for receiving includes an invert terminal and a non-invert input input terminal whereby said system has an invert mode and a non-invert mode.

9. The system of claim 2 or 5 wherein said means for receiving includes an invert input terminal and a non-invert input terminal whereby said system has an invert mode and a non-invert mode.

* * * * *

UNITED STATES PATENT AND TRADEMARK OFFICE
CERTIFICATE OF CORRECTION

PATENT NO. : 4,467,224

DATED : August 21, 1984

INVENTOR(S) : William Joseph Maddox

It is certified that error appears in the above-identified patent and that said Letters Patent is hereby corrected as shown below:

Column 6, Claim 8, line 7, after "invert" insert --input--.

Signed and Sealed this

Twenty-sixth Day of February 1985

[SEAL]

Attest:

DONALD J. QUIGG

Attesting Officer

Acting Commissioner of Patents and Trademarks